US010515840B2

(12) United States Patent
Zhao et al.

(10) Patent No.: US 10,515,840 B2
(45) Date of Patent: Dec. 24, 2019

(54) EXPANDING METHOD AND EXPANDING APPARATUS

(71) Applicant: DISCO CORPORATION, Tokyo (JP)

(72) Inventors: Jinyan Zhao, Tokyo (JP); Yoshiaki Yodo, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 34 days.

(21) Appl. No.: 15/994,458

(22) Filed: May 31, 2018

(65) Prior Publication Data

US 2018/0350651 A1    Dec. 6, 2018

(30) Foreign Application Priority Data

Jun. 5, 2017    (JP) ................................ 2017-110693

(51) Int. Cl.
*H01L 21/683*    (2006.01)
*H01L 21/78*    (2006.01)

(52) U.S. Cl.
CPC ...... *H01L 21/6836* (2013.01); *H01L 21/6838* (2013.01); *H01L 21/78* (2013.01)

(58) Field of Classification Search
None
See application file for complete search history.

(56) References Cited

U.S. PATENT DOCUMENTS

| 7,887,665 B2* | 2/2011 | Kubo ............... H01L 21/67132 156/249 |
| 9,093,519 B2* | 7/2015 | Yamashita ........... H01L 21/302 |
| 2009/0215246 A1* | 8/2009 | Kitahara .................. C09J 5/06 438/463 |
| 2018/0358256 A1* | 12/2018 | Ueki ................... H01L 21/6836 |

FOREIGN PATENT DOCUMENTS

JP    2010206136 A    9/2010

* cited by examiner

*Primary Examiner* — Andres Munoz
(74) *Attorney, Agent, or Firm* — Greer Burns & Crain Ltd.

(57) ABSTRACT

An expanding method for expanding an expandable sheet is provided. A wafer is attached to a central portion of the expandable sheet and an annular frame is attached to a peripheral portion of the expandable sheet. The expanding method includes an annular frame holding step of holding the annular frame by using a holding unit, an expanding step of pushing the expandable sheet by using a pushing unit, thereby expanding the expandable sheet, a suction holding step of holding the wafer through the expandable sheet on a holding table under suction, and a push force removing step of removing a push force applied from the pushing unit to the expandable sheet. A minute projection for preventing the shrinkage of the expandable sheet is formed on the holding table along the outer circumference thereof.

2 Claims, 11 Drawing Sheets

EXPANDING METHOD AND EXPANDING APPARATUS

BACKGROUND OF THE INVENTION

Field of the Invention

The present invention relates to an expanding method and apparatus for expanding an expandable sheet having a central portion and a peripheral portion formed around the central portion, the central portion of the expandable sheet being attached to the back side of a workpiece, the peripheral portion of the expandable sheet being attached to an annular frame having a central opening, the workpiece being located in the central opening of the annular frame.

Description of the Related Art

As a method of dividing a workpiece such as a wafer into individual chips, there is a method including the steps of applying a laser beam to the workpiece along division lines in the condition where the laser beam is focused inside the workpiece to thereby form a modified layer inside the workpiece along each division line, and next applying an external force to the workpiece to thereby break the workpiece along each modified layer, thus dividing the workpiece into the individual chips as increasing the spacing between any adjacent ones of the individual chips. As an apparatus for dividing the workpiece by applying an external force as mentioned above, there has been proposed a work dividing apparatus described in Japanese Patent Laid-Open No. 2010-206136, for example. In this work dividing apparatus, a wafer is supported through an expandable sheet to an annular frame, and a modified layer is previously formed inside the wafer along each division line as a division start point. This wafer is divided along each modified layer by applying an external force from dividing means. Thereafter, the annular frame is held by frame holding means, and the wafer is held through the expandable sheet on a holding table under suction. In this condition, an annular area of the expandable sheet as defined between the outer circumference of the wafer and the inner circumference of the annular frame is heated by a heater to thereby heat-shrink the annular area. As a result, the spacing between the adjacent chips divided from the wafer is maintained.

SUMMARY OF THE INVENTION

However, when the expansion of the expandable sheet is canceled in the condition where the wafer is held on the holding table under suction, there is a possibility that the expandable sheet may be wavingly moved to shrink, causing the leakage of a vacuum applied to the holding table. As a result, there is a problem such that the wafer cannot be reliably held on the holding table under suction and that the spacing between the adjacent chips cannot therefore be maintained. When the spacing between the adjacent chips cannot be maintained, there is a possibility that the adjacent chips may come into contact with each other to cause damage to the chips in handling the wafer later.

It is therefore an object of the present invention to provide an expanding method and apparatus which can reliably maintain the spacing between the adjacent chips.

In accordance with a first aspect of the present invention, there is provided an expanding method for expanding an expandable sheet having a central portion and a peripheral portion formed around the central portion, the central portion of the expandable sheet being attached to the back side of a workpiece, the peripheral portion of the expandable sheet being attached to an annular frame having a central opening, the workpiece being located in the central opening of the annular frame. The expanding method includes an annular frame holding step of holding the annular frame by using a holding unit having a holding surface for holding the annular frame; an expanding step of pushing an annular area of the expandable sheet in a direction perpendicular to the holding surface by using a pushing unit in the condition where the annular frame is held by the holding unit, thereby expanding the expandable sheet, the annular area being defined between the outer circumference of the workpiece and the inner circumference of the annular frame; a suction holding step of holding the workpiece through the expandable sheet on a holding table under suction in the condition where the expandable sheet is expanded by the pushing unit; and a push force removing step of removing a push force applied from the pushing unit to the annular area of the expandable sheet after performing the suction holding step. A minute projection for preventing the shrinkage of the expandable sheet is formed on the holding table along the outer circumference thereof.

In accordance with a second aspect of the present invention, there is provided an expanding apparatus for expanding an expandable sheet having a central portion and a peripheral portion formed around the central portion, the central portion of the expandable sheet being attached to the back side of a workpiece, the peripheral portion of the expandable sheet being attached to an annular frame having a central opening, the workpiece being located in the central opening of the annular frame. The expanding apparatus includes a holding unit having a holding surface for holding the annular frame; a pushing unit for pushing an annular area of the expandable sheet in a direction perpendicular to the holding surface in the condition where the annular frame is held by the holding unit, thereby expanding the expandable sheet, the annular area being defined between the outer circumference of the workpiece and the inner circumference of the annular frame; a moving unit for moving the pushing unit between a pushing position where the expandable sheet is pushed by the pushing unit and a retracted position where the pushing unit is retracted from the pushing position; and a holding table having a suction holding surface for holding the workpiece through the expandable sheet under suction in the condition where the expandable sheet is expanded by the pushing unit. A minute projection for preventing the shrinkage of the expandable sheet is formed on the holding table along the outer circumference thereof.

As described above, the expanding method according to the first aspect of the present invention includes the annular frame holding step of holding the annular frame by using the holding unit having the holding surface for holding the annular frame, the expanding step of pushing an annular area of the expandable sheet in a direction perpendicular to the holding surface by using the pushing unit in the condition where the annular frame is held by the holding unit, thereby expanding the expandable sheet, the annular area being defined between the outer circumference of the workpiece and the inner circumference of the annular frame, the suction holding step of holding the workpiece through the expandable sheet on the holding table under suction in the condition where the expandable sheet is expanded by the pushing unit, and the push force removing step of removing a push force applied from the pushing unit to the annular area of the expandable sheet after performing the suction holding step, and a minute projection for preventing the shrinkage of the expandable sheet is formed on the holding table along the outer circumference thereof. Accordingly, in performing the push force removing step, there is no possibility that the expandable sheet may shrink to cause the leakage of a vacuum from the suction holding surface of the holding table. That is, according to the present invention, the shrinkage of the expandable sheet can be prevented by the minute projection, and the suction holding of the workpiece divided into chips can also be maintained. Accordingly, the spacing between the adjacent chips can be reliably maintained. As a result, it is possible to prevent the possibility that the adjacent chips may come into contact with each other to cause damage to the chips in handling the workpiece later.

The expanding apparatus according to the second aspect of the present invention includes the holding unit having the holding surface for holding the annular frame, the pushing unit for pushing an annular area of the expandable sheet in a direction perpendicular to the holding surface in the condition where the annular frame is held by the holding unit, thereby expanding the expandable sheet, the annular area being defined between the outer circumference of the workpiece and the inner circumference of the annular frame, the moving unit for moving the pushing unit between the pushing position where the expandable sheet is pushed by the pushing unit and the retracted position where the pushing unit is retracted from the pushing position, and the holding table having the suction holding surface for holding the workpiece through the expandable sheet under suction in the condition where the expandable sheet is expanded by the pushing unit, and a minute projection for preventing the shrinkage of the expandable sheet is formed on the holding table along the outer circumference thereof. Accordingly, in expanding the expandable sheet to define a spacing between the adjacent chips, next holding the workpiece on the holding table under suction, and next removing the push force applied to the expandable sheet, there is no possibility that the expandable sheet may shrink to cause the leakage of a vacuum from the suction holding surface of the holding table. Accordingly, the spacing between the adjacent chips can be reliably maintained. As a result, it is possible to prevent the possibility that the adjacent chips may come into contact with each other to cause damage to the chips in handling the workpiece later.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

1. Wafer Unit

Figure 1:
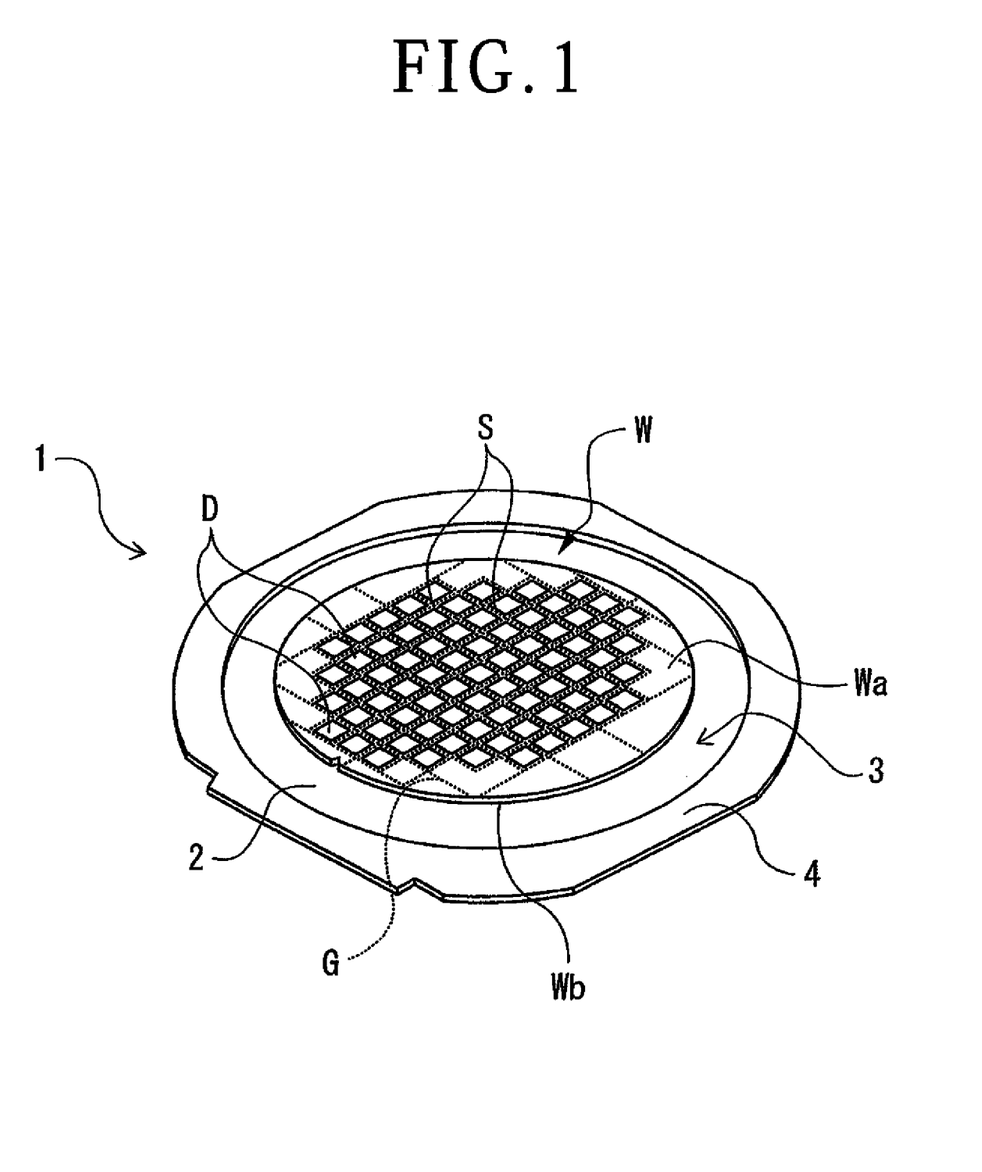
FIG. 1 is a perspective view depicting the configuration of a wafer unit.

FIG. 1 depicts a wafer W as a circular plate-shaped workpiece. The wafer W has a front side Wa and a back side Wb opposite to the front side Wa. A plurality of crossing division lines S are formed on the front side Wa of the wafer W to thereby define a plurality of separate regions where a plurality of devices D are formed. An adhesive tape (not depicted) called die attach film (DAF) is attached to the back side Wb of the wafer W, and an expandable sheet 2 is attached to the adhesive tape. Accordingly, the expandable sheet 2 is attached through the adhesive tape to the back side Wb of the wafer W. The expandable sheet 2 has a size (diameter) larger than the size (diameter) of the wafer W. The expandable sheet 2 has a two-layer structure composed of a base layer and a paste layer formed on the base layer. The base layer is formed of polyolefin, polyvinyl chloride, or polypropylene, for example. The expandable sheet 2 has expandability.

In dividing the wafer W into plural chips individually having the devices D, a wafer unit 1 depicted in FIG. 1 is prepared. The wafer unit 1 is composed of the wafer W, the expandable sheet 2 attached at its central portion to the back side Wb of the wafer W, and an annular frame 4 supporting a peripheral portion of the expandable sheet 2. More specifically, the annular frame 4 has a central opening, and the peripheral portion of the expandable sheet 2 is attached to the lower surface of the annular frame 4. Accordingly, the central portion of the expandable sheet 2 is exposed to the central opening of the annular frame 4, and the back side Wb of the wafer W is attached to this central portion of the expandable sheet 2 in the condition where the front side Wa of the wafer W is exposed upward. Thus, the wafer W is attached to the expandable sheet 2 supported at its peripheral portion to the annular frame 4 so as to close the central opening of the annular frame 4. In the wafer unit 1, a ringlike exposed area 3 is defined in the expandable sheet 2 between the outer circumference of the wafer W and the inner circumference of the annular frame 4. This ringlike exposed area 3 of the expandable sheet 2 is an area where an external force is applied to the expandable sheet 2 in expanding the expandable sheet 2. Further, this ringlike exposed area 3 of the expandable sheet 2 is also a slack area where the expandable sheet 2 is prone to slack after it is expanded to divide the wafer W. The wafer W in this preferred embodiment is previously laser-processed in such a manner that a laser beam is applied to the front side Wa of the wafer W along all the division lines S to form a division start point G inside the wafer W along each division line S. This division start point G is a modified layer where the strength in the wafer W has been reduced by the application of the laser beam. However, the division start point G is not limited to such a modified layer. For example, the division start point G may be a cut groove formed by using a cutting blade to fully cut the wafer W along each division line S or may be a laser processed groove formed by applying a laser beam along each division line S to fully cut the wafer W along each division line S.

2. Expanding Apparatus

Figure 2:
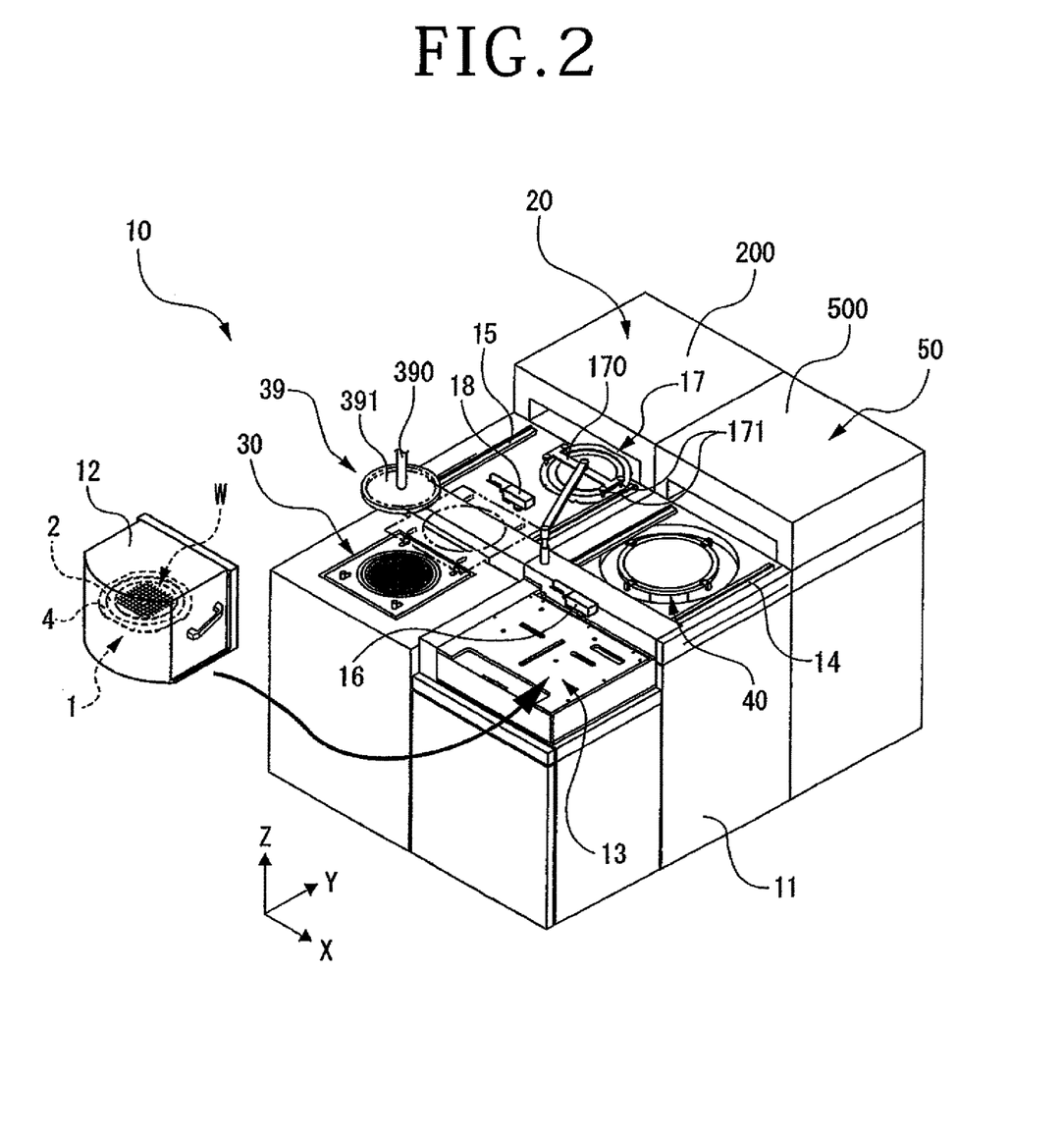
FIG. 2 is a perspective view depicting the configuration of an expanding apparatus.

FIG. 2 depicts an expanding apparatus 10. The expanding apparatus 10 is an apparatus for dividing the wafer W of the wafer unit 1 along the division lines S and also expanding the expandable sheet 2 attached to the back side Wb of the wafer W. In this case, the wafer W is located in the central opening of the annular frame 4 and the peripheral portion of the expandable sheet 2 is attached to the annular frame 4. As depicted in FIG. 2, the expanding apparatus 10 has a base housing 11. There are provided on the upper surface of the base housing 11 a cassette mounting stage 13 for mounting a cassette 12 thereon, a dividing unit 20 having a chamber 200 for dividing the wafer W by expanding the expandable sheet 2, a heat shrink unit 30 for heating the slack area 3 where the expandable sheet 2 has become slack after it is expanded by the dividing unit 20, thereby heat-shrinking the slack area 3, a cleaning unit 40 for cleaning the wafer W, and an ultraviolet applying unit 50 having a chamber 500 for applying ultraviolet light to the expandable sheet 2 to thereby cure the same.

A plurality of wafer units 1 are stored in the cassette 12 so as to be stacked in a vertical direction. The cassette 12 is detachably set on the cassette mounting stage 13. The cassette mounting stage 13 is vertically movable in the Z direction depicted by an arrow Z in FIG. 2. By vertically moving the cassette mounting stage 13, one of the plural wafer units 1 stored in the cassette 12 is set to a predetermined drawing position before processing.

A push-pull unit 16 for drawing the wafer unit 1 from the cassette 12 before processing or storing the wafer unit 1 into the cassette 12 after processing is provided in the vicinity of the cassette mounting stage 13. The wafer unit 1 drawn from the cassette 12 by the push-pull unit 16 is temporarily placed on a pair of first guide rails 14 provided in the vicinity of the cassette mounting stage 13 on the rear side thereof. The first guide rails 14 extend in parallel to each other in the Y direction depicted by an arrow Y in FIG. 2. Each first guide rail 14 has an L-shaped cross section. The first guide rails 14 are adapted to be moved toward and away from each other in the X direction depicted by an arrow X in FIG. 2. Accordingly, when the wafer unit 1 is placed on the first guide rails 14 and the first guide rails 14 are next moved toward each other, the first guide rails 14 come into engagement with the outer circumference of the annular frame 4 of the wafer unit 1, thereby setting the wafer unit 1 at a predetermined transfer start position.

A transfer unit 17 rotatable about a vertical axis is provided at the center of the upper surface of the base housing 11. The transfer unit 17 includes a frame support portion 170 and a plurality of suction pads 171 mounted at the opposite ends of the frame support portion 170 for holding the annular frame 4 under suction. A pair of second guide rails 15 similar in configuration to the first guide rails 14 are provided adjacent to the first guide rails 14 in the X direction. The second guide rails 15 are located on the front side of the dividing unit 20. The transfer unit 17 functions to transfer the wafer unit 1 between the first guide rails 14 and the second guide rails 15 and also functions to transfer the wafer unit 1 between the second guide rails 15 and the heat shrink unit 30. A push-pull unit 18 is provided between the dividing unit 20 and the heat shrink unit 30. The push-pull unit 18 functions to push and pull the wafer unit 1 placed on the second guide rails 15 with respect to the dividing unit 20 and the heat shrink unit 30.

Figure 3:
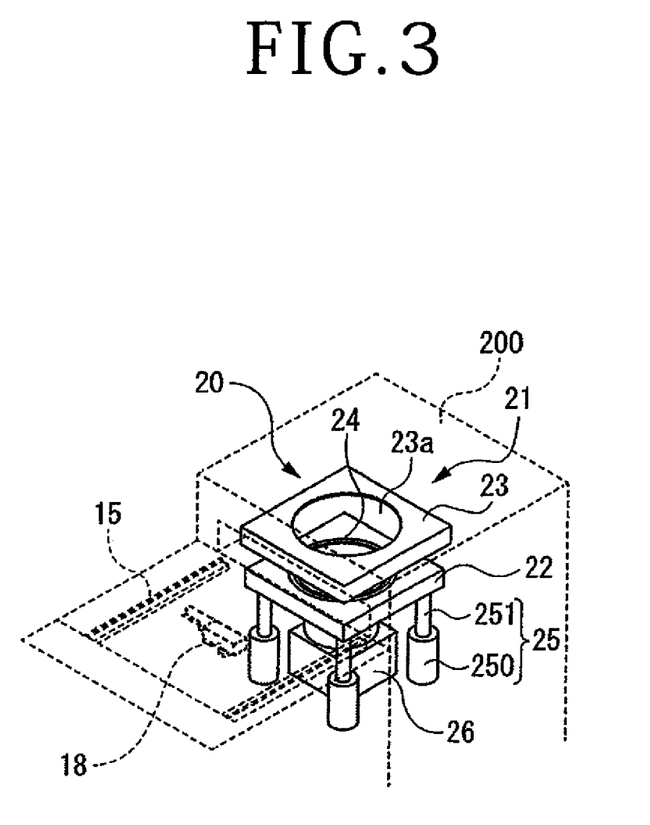
FIG. 3 is a perspective view depicting the configuration of a dividing unit.

As depicted in FIG. 3, the dividing unit 20 includes holding means 21 for holding the annular frame 4 and a push-up member 24 as pushing means for pushing up the expandable sheet 2 depicted in FIG. 2. The holding means 21 and the push-up member 24 are provided in the chamber 200. The holding means 21 includes a frame mounting plate 22 and a frame holding plate 23. The frame mounting plate 22 has a central opening (not depicted) and has an upper surface for mounting the lower surface of the annular frame 4. The frame holding plate 23 has a central opening 23a and has a lower surface for holding the upper surface of the annular frame 4. The frame holding plate 23 is fixed in position, and the frame mounting plate 22 is vertically movable by a plurality of elevating mechanisms 25. Each elevating mechanism 25 is composed of an air cylinder 250 and a piston 251. The upper end of each piston 251 is fixed to the lower surface of the frame mounting plate 22. Accordingly, when the annular frame 4 is mounted on the frame mounting plate 22 and the frame mounting plate 22 is raised by the elevating mechanisms 25, the annular frame 4 is sandwiched between the frame mounting plate 22 and the frame holding plate 23. Thus, the wafer unit 1 can be held by the holding means 21.

The push-up member 24 is a cylindrical member and it is vertically movable by moving means 26. In the condition where the wafer unit 1 is held by the holding means 21, the slack area 3 of the expandable sheet 2 is positioned directly above the upper end of the push-up member 24. Although not depicted, the moving means 26 is composed of an air cylinder and a piston. Accordingly, when the push-up member 24 is raised by the moving means 26, the slack area 3 of the expandable sheet 2 can be pushed up by the upper end of the push-up member 24. A plurality of rollers 24a (see FIGS. 7A to 7D) are rotatably mounted at the upper end of the push-up member 24, so as to reduce the friction between the push-up member 24 and the expandable sheet 2 in pushing up the expandable sheet 2. A cooling nozzle (not depicted) is provided in the chamber 200, so as to cool the inside space of the chamber 200 to 10° C. or less in dividing the wafer W.

Figure 4:
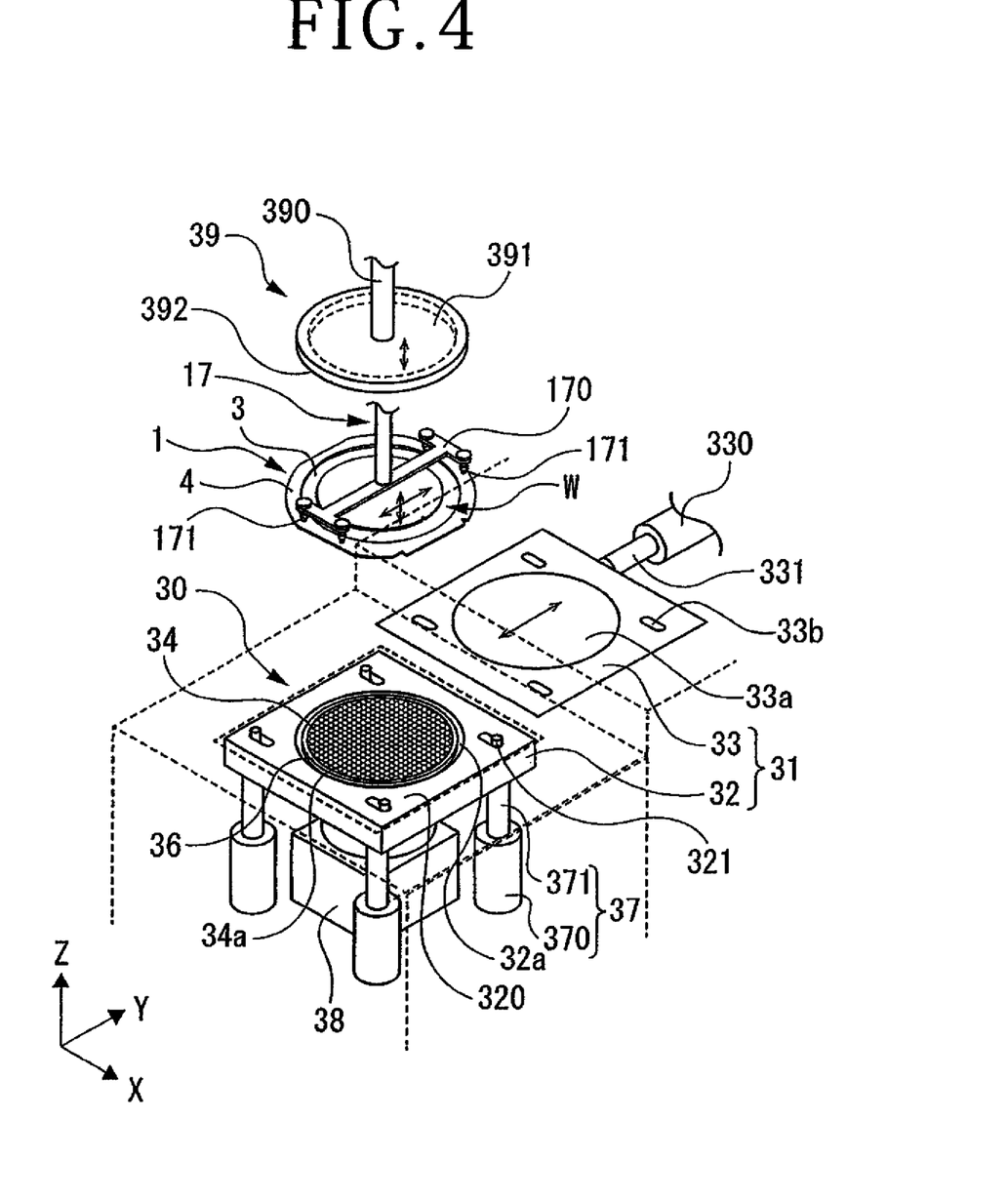
FIG. 4 is a perspective view depicting the configuration of a heat shrink unit.

As depicted in FIG. 4, the heat shrink unit 30 includes holding means (holding unit) 31, a push-up member 36 as pushing means (pushing unit), moving means (moving unit) 38, a holding table 34, and heating means 39. The holding means 31 has a holding surface 320 for holding the annular frame 4. The push-up member 36 functions to push up the slack area 3 of the expandable sheet 2 in the direction perpendicular to the holding surface 320. In this case, the slack area 3 is defined between the inner circumference of the annular frame 4 held by the holding means 31 and the outer circumference of the wafer W. The moving means 38 functions to move the push-up member 36 between a pushing position where the expandable sheet 2 is pushed up by the push-up member 36 and a retracted position where the push-up member 36 is retracted from the pushing position. The holding table 34 has a suction holding surface 34a for holding the wafer W through the expandable sheet 2 under suction in the condition where the expandable sheet 2 is expanded. The heating means 39 functions to heat the slack area 3 of the expandable sheet 2.

The holding means 31 includes a frame mounting plate 32 and a frame holding plate 33. The frame mounting plate 32 has a central opening 32a and has an upper surface (holding surface 320) for mounting the lower surface of the annular frame 4. The frame holding plate 33 has a central opening 33a and has a lower surface for holding the upper surface of the annular frame 4. The frame mounting plate 32 is vertically movable in the Z direction by a plurality of elevating mechanisms 37. Each elevating mechanism 37 is composed of an air cylinder 370 and a piston 371. The upper end of each piston 371 is fixed to the lower surface of the frame mounting plate 32. Accordingly, when each piston 371 is vertically moved, the frame mounting plate 32 can be vertically moved in the Z direction. Further, four centering guides 321 movable in the X direction are provided at the four corner portions of the frame mounting plate 32 having a rectangular shape. Accordingly, the centering guides 321 are moved in the X direction to adjust the position of the annular frame 4 placed on the holding surface 320 of the frame mounting plate 32, thereby centering the wafer unit 1.

The frame holding plate 33 is also a rectangular member having substantially the same size as that of the frame mounting plate 32. A horizontally moving mechanism composed of an air cylinder 330 and a piston 331 is connected to the frame holding plate 33, so as to move the frame holding plate 33 in a horizontal direction (Y direction) to the position above the frame mounting plate 32. Four elongated holes 33b for receiving the four respective centering guides 321 of the frame mounting plate 32 are formed at the four corner portions of the frame holding plate 33. Accordingly, when the annular frame 4 is mounted on the frame mounting plate 32 and the frame mounting plate 32 is raised by the elevating mechanisms 37, the annular frame 4 is sandwiched between the frame mounting plate 32 and the frame holding plate 33 horizontally moved to the position directly above the frame mounting plate 32. Thus, the wafer unit 1 can be held by the holding means 31.

The heating means 39 includes a rod 390 adapted to be vertically expanded and contracted by an air cylinder (not depicted), a flange member 391 fixed to the lower end of the rod 390, and an annular heating member 392 fixed to the lower surface of the flange member 391. The heating member 392 is adapted to downward apply infrared light to the slack area 3 of the expandable sheet 2 to thereby heat the slack area 3, thus heat-shrinking the slack area 3.

Figure 5:
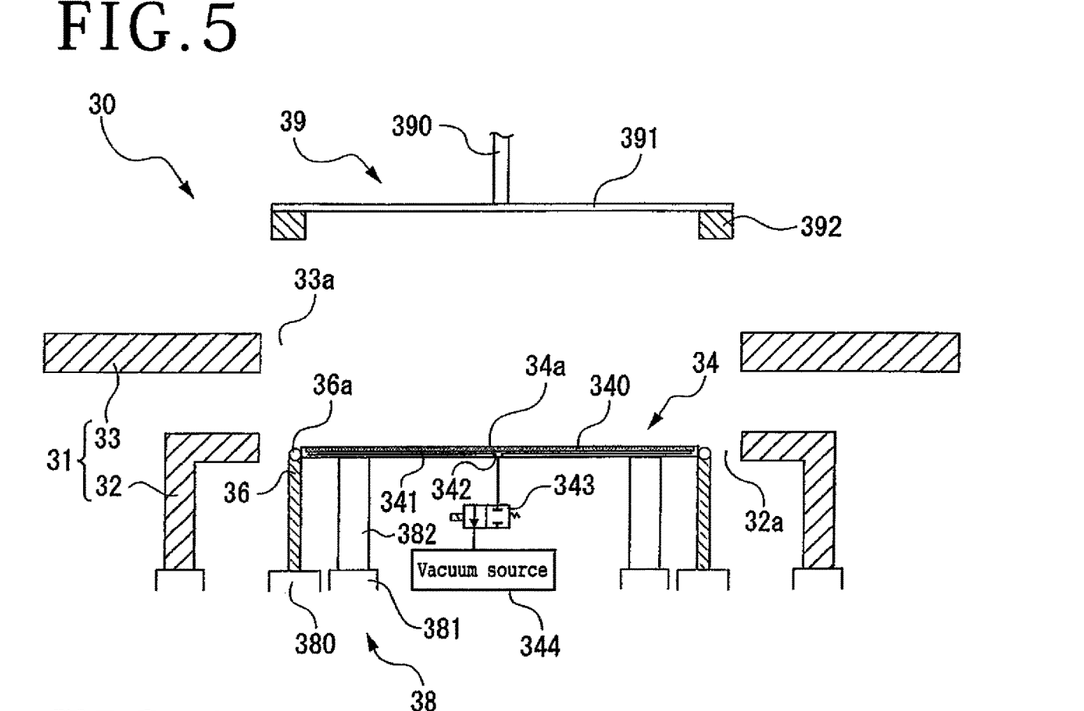
FIG. 5 is a sectional view depicting the configuration of the heat shrink unit depicted in FIG. 4.

The push-up member 36 is similar in configuration to the push-up member 24 of the dividing unit 20. That is, the push-up member 36 is a cylindrical member and it is vertically movable in the Z direction by the moving means 38. In the condition where the wafer unit 1 is held by the holding means 31, the slack area 3 of the expandable sheet 2 is positioned directly above the upper end of the push-up member 36. As depicted in FIG. 5, a plurality of rollers 36a are rotatably mounted at the upper end of the push-up member 36, so as to reduce the friction between the push-up member 36 and the expandable sheet 2 in pushing up the expandable sheet 2. The moving means 38 includes an air cylinder 380 for vertically moving the push-up member 36 between the pushing position and the retracted position mentioned above. The pushing position is a position where the slack area 3 of the expandable sheet 2 is pushed up by the rollers 36a of the push-up member 36 raised by the air cylinder 380. The retracted position is a position where the rollers 36a are separated from the slack area 3 by operating the air cylinder 380 to lower the push-up member 36.

Figure 6:
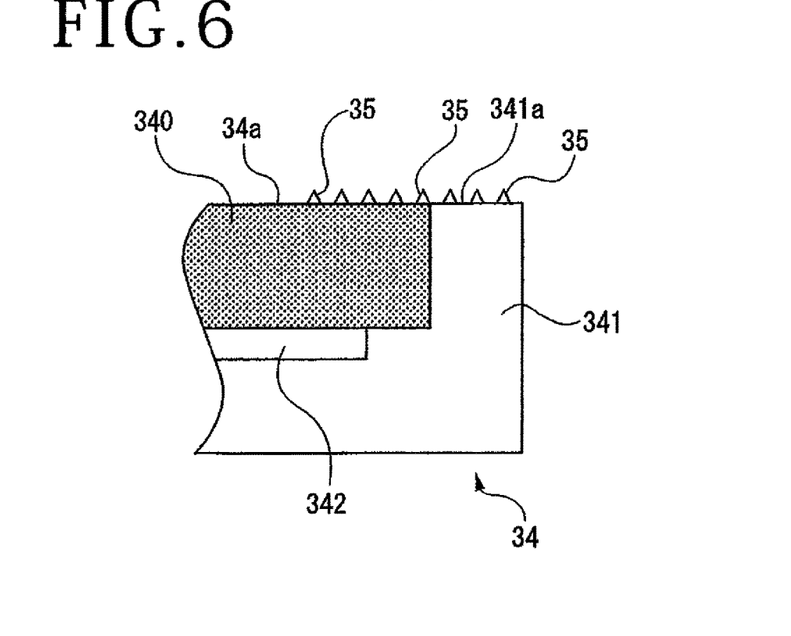
FIG. 6 is an enlarged sectional view of a part of a holding table.

The holding table 34 is provided inside the push-up member 36. The holding table 34 includes a porous plate 340 having the suction holding surface 34a for holding the wafer W under suction and a frame member 341 surrounding the porous plate 340. The porous plate 340 is a disk-shaped member formed of a porous material such as porous ceramic. The suction holding surface 34a of the porous plate 340 is similar in shape to the wafer W and has substantially the same area as that of the wafer W. As depicted in FIG. 6, the frame member 341 is formed of stainless steel, for example, and has an upper surface 341a flush with the suction holding surface 34a.

As depicted in FIG. 5, the frame member 341 has a central suction passage 342 communicating with the porous plate 340. The suction passage 342 is connected through a valve 343 to a vacuum source 344. Accordingly, when the valve 343 is opened, the porous plate 340 comes into communication with the vacuum source 344, so that a suction force (vacuum) generated by the vacuum source 344 can be applied to the suction holding surface 34a, thereby holding the wafer W on the suction holding surface 34a under suction. The moving means 38 includes the air cylinder 380 for vertically moving the push-up member 36 as mentioned above and further includes an air cylinder 381 and a piston 382 for vertically moving the holding table 34. The upper end of the piston 382 is fixed to the holding table 34. Accordingly, the holding table 34 can be vertically moved by operating the air cylinder 381 to vertically move the piston 382.

As depicted in FIG. 6, a plurality of minute projections 35 for preventing the shrinkage of the expandable sheet 2 are formed on the upper surface of the holding table 34 along the outer circumference thereof. Each minute projection 35 depicted in FIG. 6 has a pointed upper end that can restrict the movement of the expandable sheet 2. More specifically, when the upward push force applied from the push-up member 36 to the slack area 3 of the expandable sheet 2 is removed in the condition where the wafer W is held on the holding table 34 under suction, there is a possibility that the slack area 3 of the expandable sheet 2 may be wavingly moved. However, the minute projections 35 function to penetrate the lower surface of the expandable sheet 2 to thereby prevent the shrinkage of the expandable sheet 2. In this preferred embodiment, the plural minute projections 35 are formed on the suction holding surface 34a of the porous plate 340 and the upper surface 341a of the frame member 341 along the outer circumference of the holding table 34. However, the minute projections 35 may be formed on only the upper surface 341a of the frame member 341. That is, it is essential that the minute projections 35 are to be formed on the upper surface of the holding table 34 along the outer circumference thereof in an annular area. The height of each minute projection 35 is set to approximately 0.05 mm to 1 mm, for example.

With the configuration that the minute projections 35 for preventing the shrinkage of the expandable sheet 2 are formed on the upper surface of the holding table 34 along the outer circumference thereof in the expanding apparatus 10 according to this preferred embodiment, the following effect can be exhibited. When the expandable sheet 2 is expanded by the push-up member 36 to thereby define a spacing between any adjacent ones of the chips and the upward push force applied from the push-up member 36 to the expandable sheet 2 is next removed in the condition where the wafer W is held on the holding table 34 under suction, there is no possibility that the expandable sheet 2 may shrink to cause the leakage of the vacuum from the suction holding surface 34a. Accordingly, the spacing between the adjacent chips can be reliably maintained. As a result, it is possible to prevent the possibility that the adjacent chips may come into contact with each other to cause damage to the chips in handling the wafer unit 1 later.

3. Expanding Method

There will now be described an operation for dividing the wafer W into the individual chips by using the dividing unit 20 and an expanding method for expanding the expandable sheet 2 by using the heat shrink unit 30, in which the expandable sheet 2 is previously attached to the back side Wb of the wafer W in the condition where the wafer W is located in the central opening of the annular frame 4 and the peripheral portion of the expandable sheet 2 is previously attached to the annular frame 4.

Figure 7A:
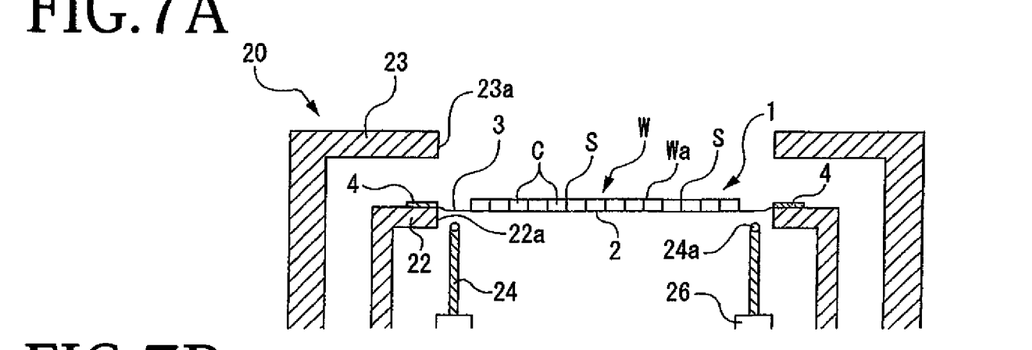
FIGS. 7A, 7B, 7C, and 7D are sectional views depicting an operation of dividing a wafer into individual chips by expanding an expandable sheet.
Figure 7B:
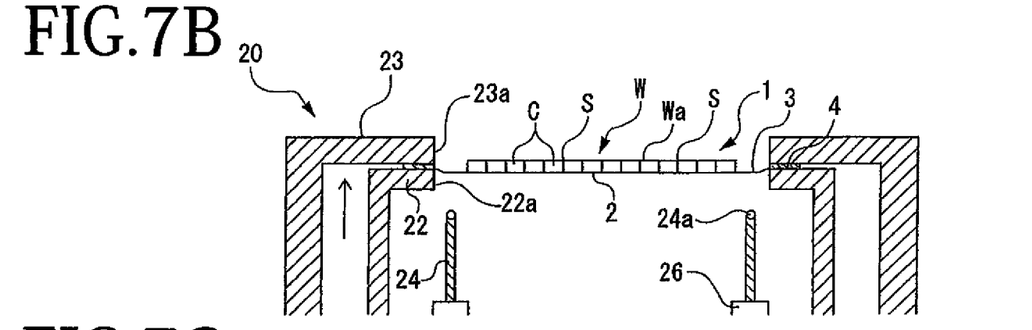

As depicted in FIG. 7A, the annular frame 4 of the wafer unit 1 is placed on the frame mounting plate 22 in the dividing unit 20. The annular frame 4 is placed on the frame mounting plate 22 in concentric relation with the central opening 22a of the frame mounting plate 22. That is, the wafer W of the wafer unit 1 is supported by the expandable sheet 2 in a floating condition in the central opening 22a of the frame mounting plate 22. As depicted in FIG. 7B, the frame mounting plate 22 is next raised to sandwich the annular frame 4 between the frame holding plate 23 and the frame mounting plate 22, so that the annular frame 4 is fixed in this vertical position. At this time, a cooling fluid is discharged from the cooling nozzle (not depicted) to thereby cool the expandable sheet 2 and the adhesive tape (DAF) into a hardened condition.

Figure 7C:
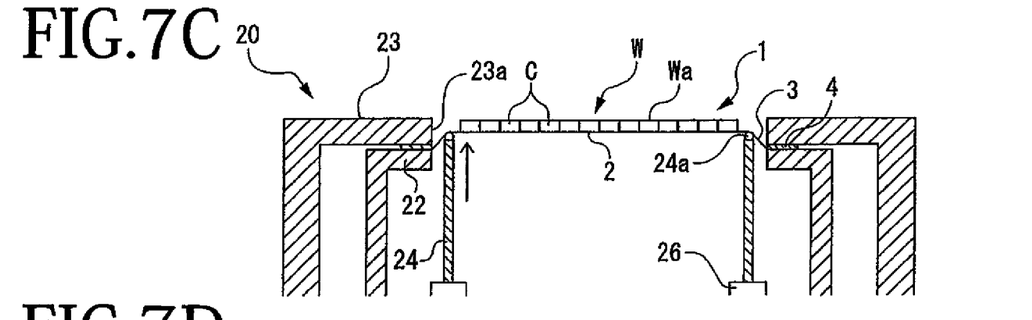
Figure 7D:
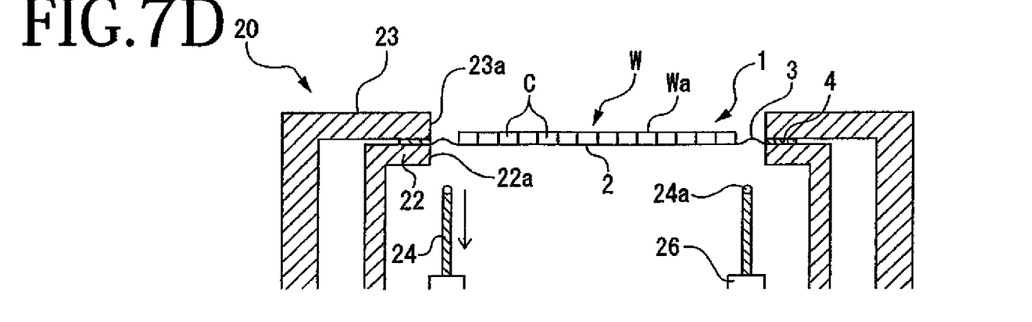

As depicted in FIG. 7C, the moving means 26 is operated to raise the push-up member 24, so that the rollers 24a mounted at the upper end of the push-up member 24 push up the slack area 3 of the expandable sheet 2 as being rotated, in the vertical direction perpendicular to the front side Wa of the wafer W. Accordingly, the wafer W and the expandable sheet 2 are raised to a predetermined expansion position by the push-up member 24, so that the expandable sheet 2 is stretched and expanded in the radial direction of the wafer W. As a result, the wafer W is divided along each division line S where the division start point G depicted in FIG. 1 is formed inside the wafer W, thereby obtaining individual chips C. Further, the adhesive tape attached to the back side Wb of the wafer W is also broken along each division line S in concert with the division of the wafer W into the individual chips C. Accordingly, each chip C has the adhesive tape (DAF) on the back side. That is, the individual chips C with the DAFs are attached to the expandable sheet 2 in the condition where any adjacent ones of the individual chips C are slightly spaced from each other. After dividing the wafer W into the individual chips C, the push-up member 24 is lowered by operating the moving means 26 as depicted in FIG. 7D. The adhesive tape has viscosity and it is hard to divide. However, the adhesive tape is previously cooled to be hardened by the cooling fluid discharged from the cooling nozzle as mentioned above, so that the adhesive tape thus hardened is expanded to be reliably divided.

(1) Mounting Step

Figure 8:
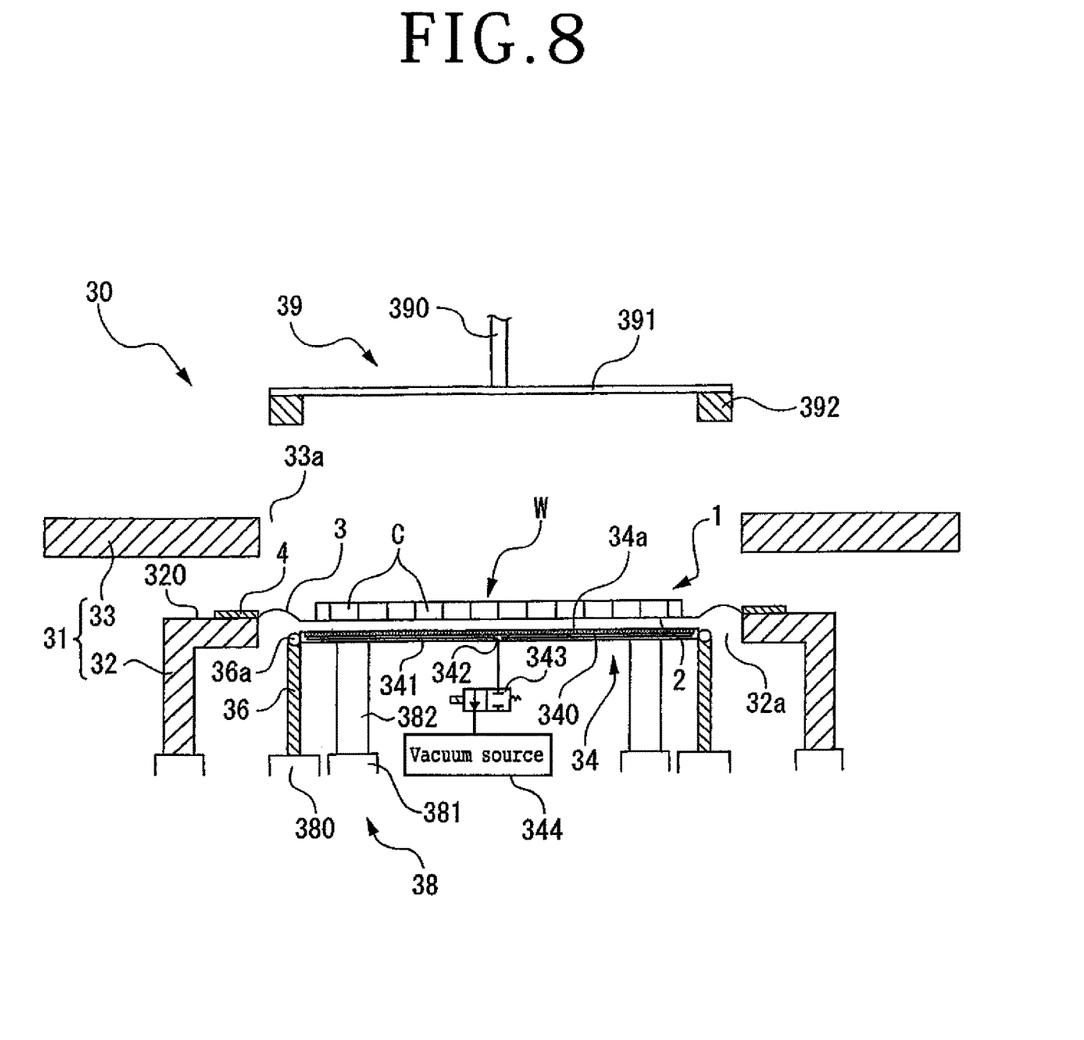
FIG. 8 is a sectional view depicting a mounting step.

After dividing the wafer W into the individual chips C in the dividing unit 20, the wafer unit 1 is removed from the frame mounting plate 22 to the second guide rails 15 by the push-pull unit 18 depicted in FIG. 3, and next transferred to the heat shrink unit 30 by the transfer unit 17 depicted in FIG. 4. More specifically, the upper surface of the annular frame 4 is held under suction by the suction pads 171 of the transfer unit 17, and the wafer unit 1 is transferred from the second guide rails 15 to the frame mounting plate 32 of the holding means 31 by the transfer unit 17 as depicted in FIG. 4. In the holding means 31, the annular frame 4 is placed on the holding surface 320 of the frame mounting plate 32 as depicted in FIG. 8. Accordingly, the annular frame 4 is placed on the frame mounting plate 32 in concentric relation with the central opening 32a in such a manner that the wafer W is supported by the expandable sheet 2 in the central opening 32a in a floating condition.

(2) Annular Frame Holding Step

Figure 9:
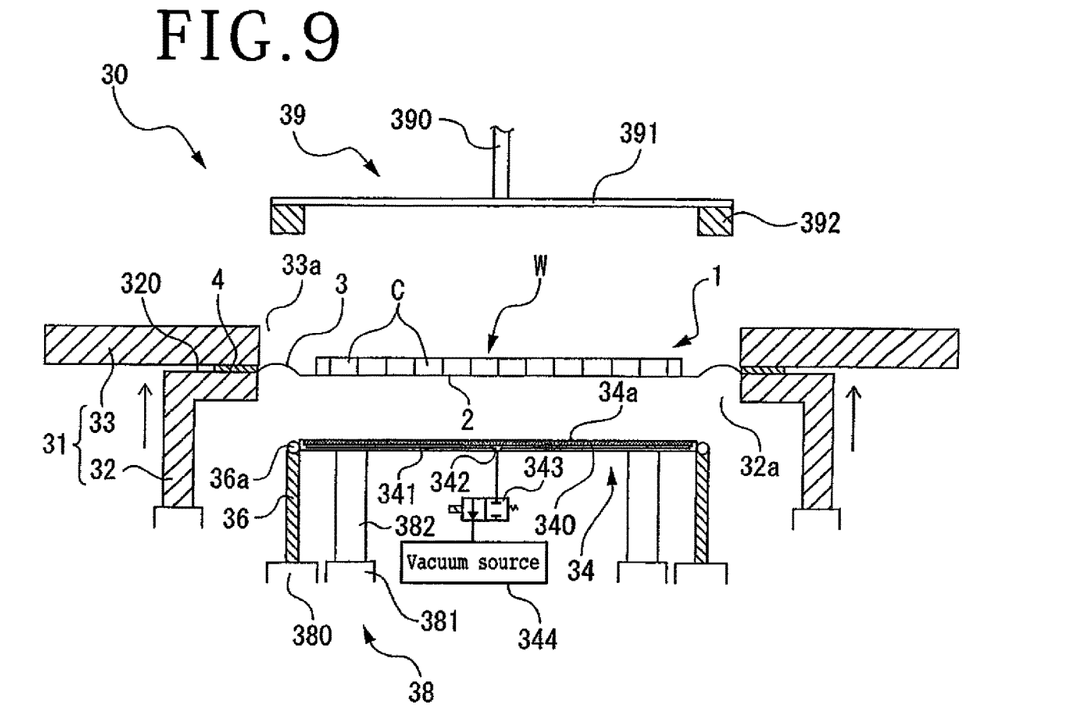
FIG. 9 is a sectional view depicting an annular frame holding step.

As depicted in FIG. 9, the frame mounting plate 32 is raised to sandwich the annular frame 4 between the frame holding plate 33 and the frame mounting plate 32. In this condition, the annular frame 4 is fixed in vertical position. At this time, the wafer W is supported by the expandable sheet 2 in the central opening 32a of the frame mounting plate 32 and the central opening 33a of the frame holding plate 33 in a floating condition. In this manner, the annular frame 4 of the wafer unit 1 is held by the holding means 31. In this condition, the slack area 3 of the expandable sheet 2 is positioned directly above the upper end of the push-up member 36.

(3) Expanding Step

Figure 10:
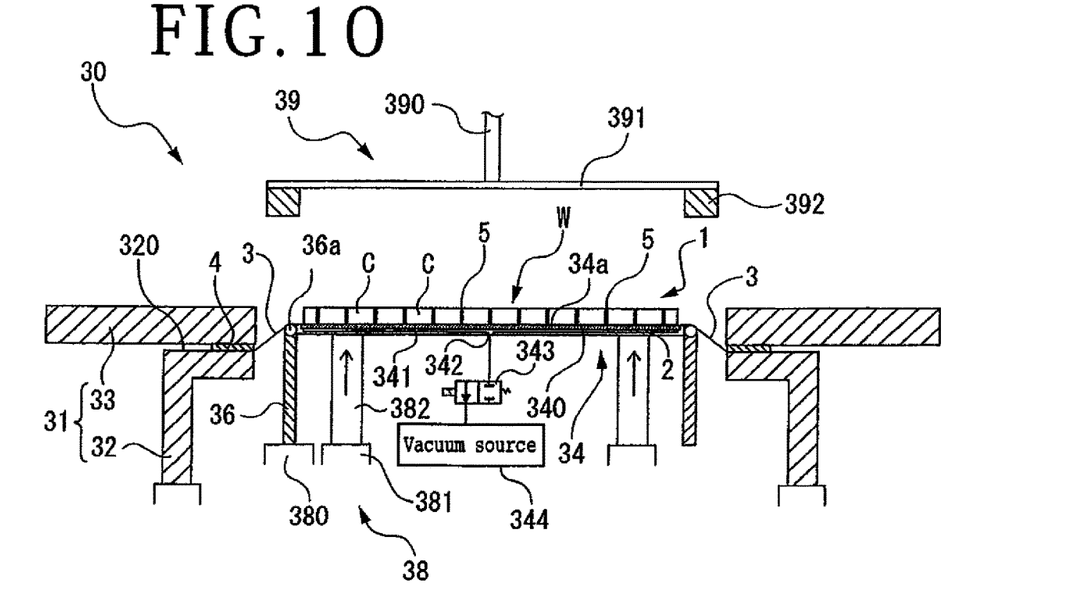
FIG. 10 is a sectional view depicting an expanding step.

As depicted in FIG. 10, in the condition where the annular frame 4 is held by the holding means 31, the slack area 3 of the expandable sheet 2 as defined between the outer circumference of the wafer W and the inner circumference of the annular frame 4 is pushed up by the push-up member 36 in the direction perpendicular to the holding surface 320, thereby expanding the expandable sheet 2. More specifically, the moving means 38 is operated to raise the push-up member 36 and the holding table 34. Accordingly, the slack area 3 of the expandable sheet 2 is pushed up by the rollers 36a mounted at the upper end of the push-up member 36 in the condition where the rollers 36a are rotated, so that the expandable sheet 2 is expanded in the radial direction of the wafer W. As a result, an external force is applied to the wafer W in the radially outward direction, and the slight spacing between any adjacent ones of the chips C is increased to define an increased spacing 5 between the adjacent chips C as depicted in FIG. 10. At this time, the valve 343 remains closed and the porous plate 340 is not in communication with the vacuum source 344.

Figure 11:
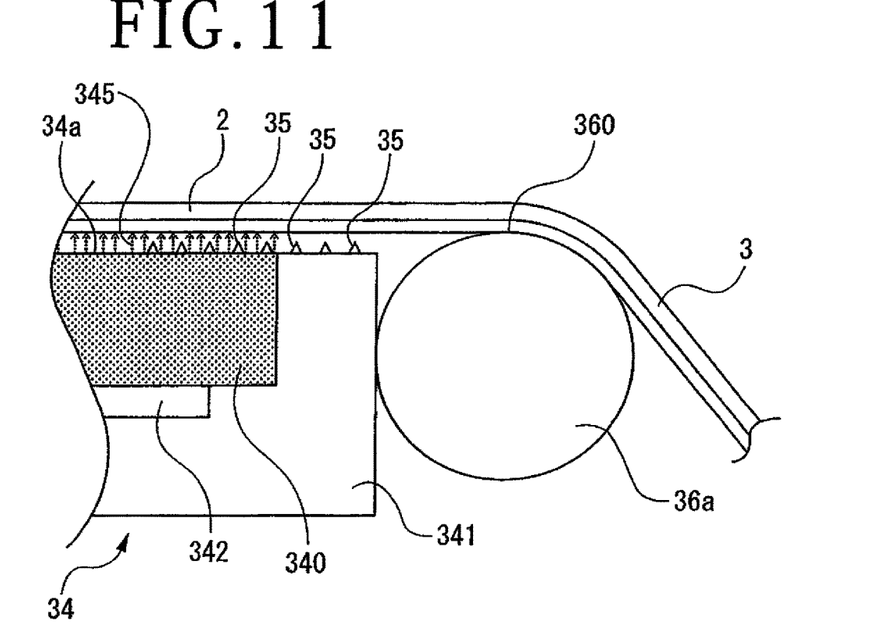
FIG. 11 is an enlarged sectional view of a part of the expandable sheet in the expanding step depicted in FIG. 10.

As depicted in FIG. 11, in the expanding step, the amount of movement of the push-up member 36 is preferably adjusted so that the upper end 360 of each roller 36a becomes higher in level than the suction holding surface 34a of the holding table 34. Accordingly, it is possible to prevent the possibility that the minute projections 35 may come into contact with the lower surface of the expandable sheet 2 to cause damage to the expandable sheet 2 in expanding the expandable sheet 2. As a modification, an air source (not depicted) may be connected to the holding table 34, and air supplied from the air source is blown upward from the suction holding surface 34a of the holding table 34 against the lower surface of the expandable sheet 2. Also in this case, the contact between the lower surface of the expandable sheet 2 and the minute projections 35 can be prevented in the expanding step.

(4) Suction Holding Step

Figure 12:
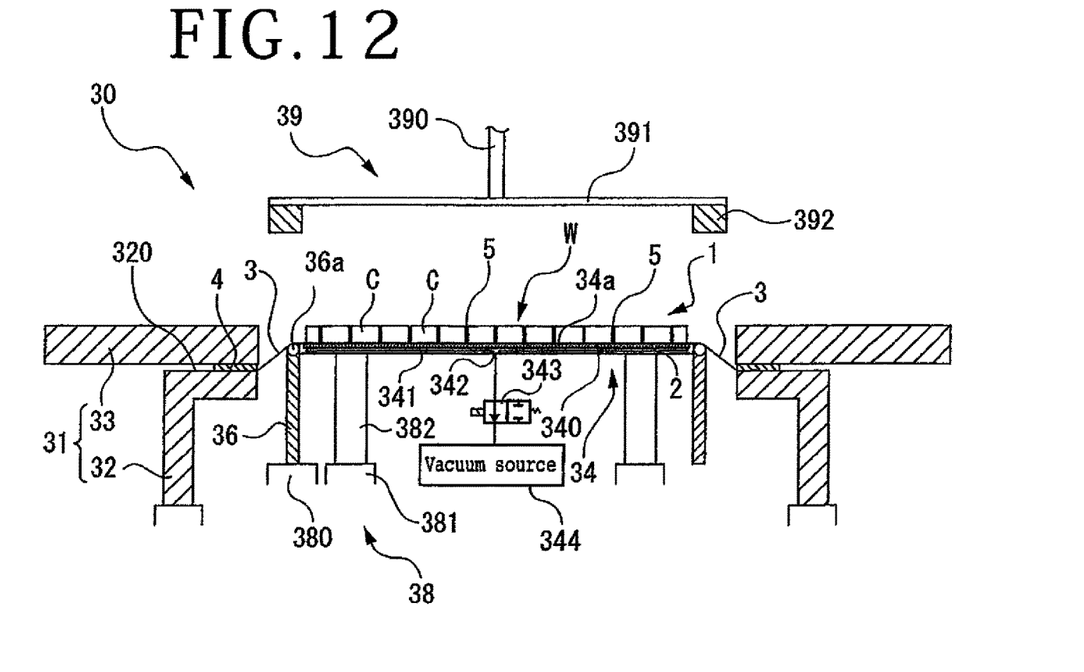
FIG. 12 is a sectional view depicting a suction holding step.
Figure 13:
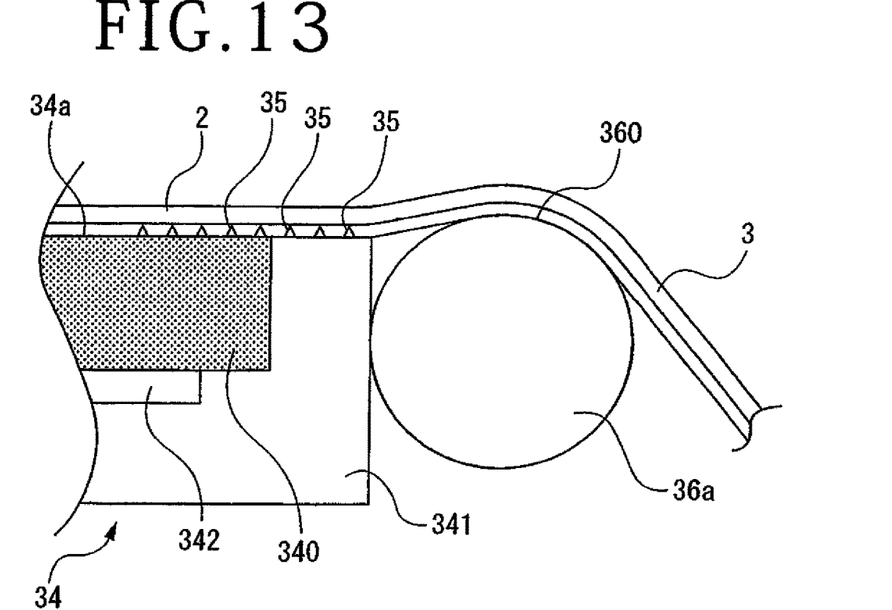
FIG. 13 is an enlarged sectional view of a part of the expandable sheet in the suction holding step depicted in FIG. 12.

As depicted in FIG. 12, in the condition where the expandable sheet 2 has been expanded in the expanding step, the valve 343 is opened to make the communication between the porous plate 340 and the vacuum source 344, so that a suction force (vacuum) generated by the vacuum source 344 is applied to the suction holding surface 34a to thereby hold the wafer W through the expandable sheet 2 on the suction holding surface 34a under suction. At this time, as depicted in FIG. 13, the expandable sheet 2 is held on the suction holding surface 34a of the holding table 34 under suction in the condition where the slack area 3 is pushed up by the roller 36a. Accordingly, the minute projections 35 penetrate the lower surface of the expandable sheet 2 as depicted in FIG. 13.

(5) Push Force Removing Step

Figure 14:
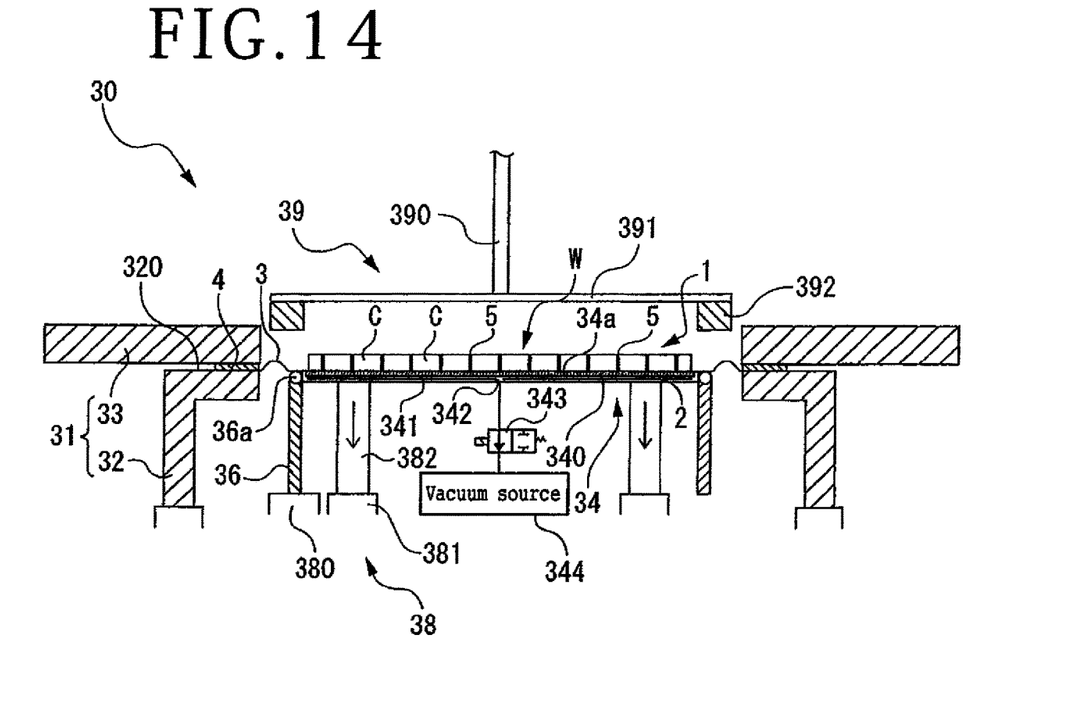
FIG. 14 is a sectional view depicting a push force removing step.
Figure 15:
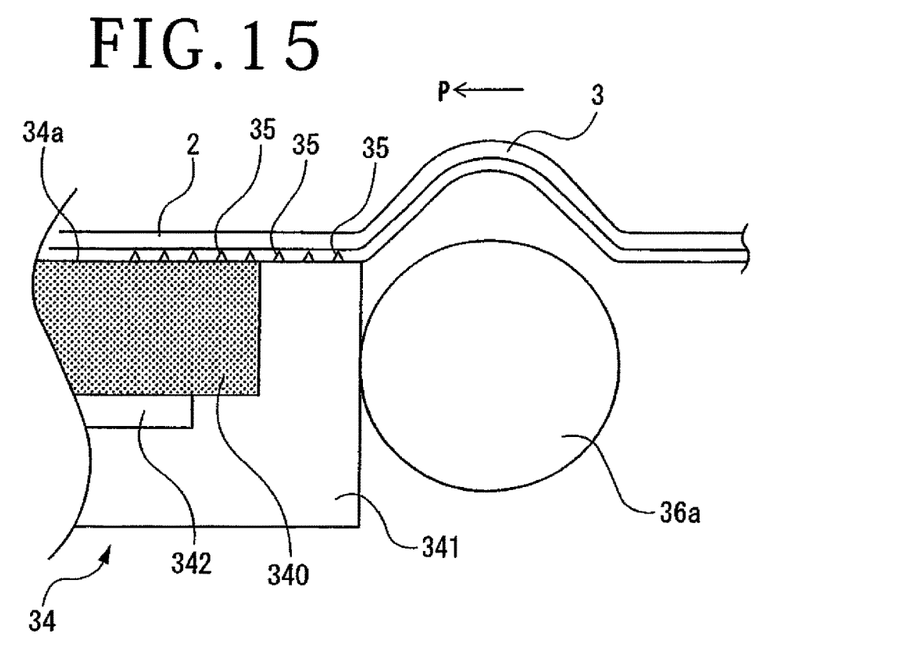
FIG. 15 is an enlarged sectional view of a part of the expandable sheet in the push force removing step depicted in FIG. 14.

After performing the suction holding step, the upward push force applied from the push-up member 36 to the expandable sheet 2 is removed. More specifically, as depicted in FIG. 14, the push-up member 36 is lowered by operating the moving means 38 in the condition where the wafer W is held on the holding table 34 under suction, thereby separating the rollers 36a from the slack area 3 of the expandable sheet 2. When the external force applied to the expandable sheet 2 is removed, the slack area 3 of the expandable sheet 2 is wavingly moved in the direction depicted by an arrow P in FIG. 15. However, since the plural minute projections 35 penetrate the lower surface of the expandable sheet 2 in a spikelike fashion, the movement of the expandable sheet 2 is restricted to thereby prevent the shrinkage of the expandable sheet 2. Accordingly, there is no possibility that the expandable sheet 2 may be separated from the suction holding surface 34a in its peripheral area to cause the leakage of the vacuum from the suction holding surface 34a.

(6) Heat Shrink Step

Figure 16:
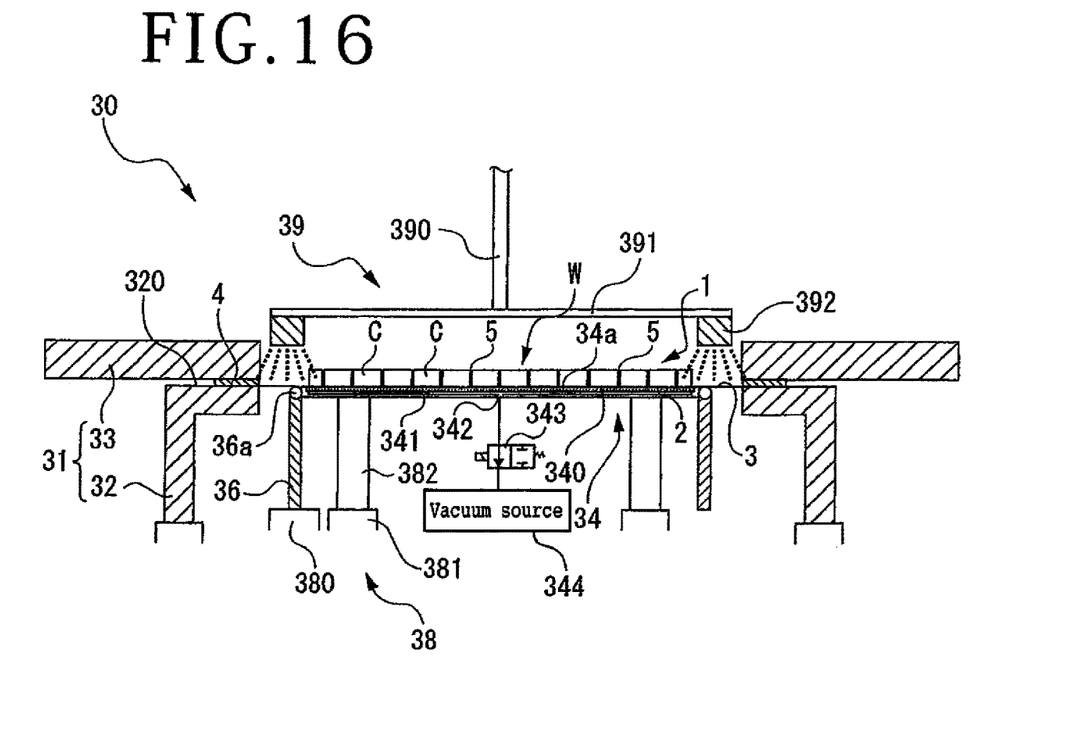
FIG. 16 is a sectional view depicting a heat shrink step.

After performing the push force removing step, the expandable sheet 2 remains expanded and the slack area 3 remains slacked. As depicted in FIG. 16, the heating means 39 is lowered to such a position that the heating member 392 is opposed to the slack area 3 of the expandable sheet 2. In this condition, infrared light is applied from the heating member 392 toward the slack area 3 to thereby heat-shrink the slack area 3. As a result, the slack area 3 is shrunk to extend parallel to the upper surface of the holding table 34, so that the spacing 5 between the adjacent chips C can be maintained. After finishing the heat shrink step, the wafer unit 1 is transferred to the cleaning unit 40 depicted in FIG. 2 to perform cleaning and drying steps. Thereafter, the wafer unit 1 is transferred to the ultraviolet applying unit 50 depicted in FIG. 2 to perform a curing step, in which ultraviolet light is applied to the expandable sheet 2 to cure the adhesive.

As described above, the expanding method according to this preferred embodiment includes the annular frame holding step of holding the annular frame 4 by operating the holding means 31; the expanding step of pushing up the slack area 3 of the expandable sheet 2 in the direction perpendicular to the holding surface 320 by operating the push-up member 36 after performing the annular frame holding step, thereby expanding the expandable sheet 2, the slack area 3 being defined between the outer circumference of the wafer W and the inner circumference of the annular frame 4; the suction holding step of holding the wafer W through the expandable sheet 2 on the holding table 34 under suction after performing the expanding step; and the push force removing step of removing the upward push force applied from the push-up member 36 to the slack area 3 after performing the suction holding step. The minute projections 35 for preventing the shrinkage of the expandable sheet 2 are formed on the upper surface of the holding table 34 along the outer circumference thereof. Accordingly, in performing the push force removing step, there is no possibility that the expandable sheet 2 may shrink to cause the leakage of the vacuum from the suction holding surface 34a. That is, according to this preferred embodiment, the shrinkage of the expandable sheet 2 can be prevented by the minute projections 35, and the suction holding of the wafer W divided can also be maintained. Accordingly, the spacing 5 between the adjacent chips C can be reliably maintained. As a result, it is possible to prevent the possibility that the adjacent chips C may come into contact with each other to cause damage to the chips C in handling the wafer unit 1 later.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. An expanding method for expanding an expandable sheet having a central portion and a peripheral portion formed around the central portion, the central portion of the expandable sheet being attached to a back side of a workpiece, the peripheral portion of the expandable sheet being attached to an annular frame having a central opening, the workpiece being located in the central opening of the annular frame, the expanding method comprising:

an annular frame holding step of holding the annular frame by using a holding unit having a holding surface for holding the annular frame;

an expanding step of pushing an annular area of the expandable sheet in a direction perpendicular to the holding surface by using a pushing unit in the condition where the annular frame is held by the holding unit, thereby expanding the expandable sheet, the annular area being defined between an outer circumference of the workpiece and an inner circumference of the annular frame;

a suction holding step of holding the workpiece through the expandable sheet on a holding table under suction in the condition where the expandable sheet is expanded by the pushing unit; and a push force removing step of removing a push force applied from the pushing unit to the annular area of the expandable sheet after performing the suction holding step, wherein a minute projection for preventing shrinkage of the expandable sheet is formed on the holding table along an outer circumference thereof.

2. An expanding apparatus for expanding an expandable sheet having a central portion and a peripheral portion formed around the central portion, the central portion of the expandable sheet being attached to a back side of a workpiece, the peripheral portion of the expandable sheet being attached to an annular frame having a central opening, the workpiece being located in the central opening of the annular frame, the expanding apparatus comprising:

a holding unit having a holding surface for holding the annular frame;

a pushing unit for pushing an annular area of the expandable sheet in a direction perpendicular to the holding surface in the condition where the annular frame is held by the holding unit, thereby expanding the expandable sheet, the annular area being defined between an outer circumference of the workpiece and an inner circumference of the annular frame;

a moving unit for moving the pushing unit between a pushing position where the expandable sheet is pushed by the pushing unit and a retracted position where the pushing unit is retracted from the pushing position; and a holding table having a suction holding surface for holding the workpiece through the expandable sheet under suction in the condition where the expandable sheet is expanded by the pushing unit, wherein a minute projection for preventing shrinkage of the expandable sheet is formed on the holding table along an outer circumference thereof.

* * * * *